United States Patent
Koh

(10) Patent No.: US 7,208,384 B2
(45) Date of Patent: Apr. 24, 2007

(54) TRANSISTORS AND MANUFACTURING METHODS THEREOF

(75) Inventor: Kwan-Ju Koh, Bucheon (KR)

(73) Assignee: Dongbu Electronics Co., Ltd., Seoul (KR)

(*) Notice: Subject to any disclaimer, the term of this patent is extended or adjusted under 35 U.S.C. 154(b) by 276 days.

(21) Appl. No.: 11/027,358

(22) Filed: Dec. 30, 2004

(65) Prior Publication Data

US 2005/0139876 A1    Jun. 30, 2005

(30) Foreign Application Priority Data

Dec. 31, 2003 (KR) .................... 10-2003-0101924

(51) Int. Cl.
*H01L 21/336* (2006.01)
(52) U.S. Cl. .................. 438/305; 257/E21.437
(58) Field of Classification Search ........... 438/300, 438/305, 307, 529; 257/E21.437
See application file for complete search history.

(56) References Cited

U.S. PATENT DOCUMENTS 6,121,099 A * 9/2000 Fulford et al. ............. 438/305
6,144,071 A * 11/2000 Gardner et al. ............ 257/344
6,482,660 B2 * 11/2002 Conchieri et al. ............ 438/7

FOREIGN PATENT DOCUMENTS

JP    02-074076    3/1990

* cited by examiner

*Primary Examiner*—Chandra Chaudhari
(74) *Attorney, Agent, or Firm*—Andrew D. Fortney

(57) ABSTRACT

Transistors and manufacturing methods thereof are disclosed. An example transistor includes a semiconductor substrate divided into device isolation regions and a device active region. The example transistor includes a gate insulating film formed in the active region of the semiconductor substrate, a gate formed on the gate insulating film, a channel region formed in the semiconductor substrate and overlapping the gate, and LDD regions formed in the semiconductor substrate and at both sides of the gate, centering the gate. In addition, the example transistor includes source and drain regions formed under the LDD regions, offset regions formed in the semiconductor substrate and between the channel region and LDD regions, and gate spacers formed at both sidewalls of the gate.

8 Claims, 7 Drawing Sheets

TRANSISTORS AND MANUFACTURING METHODS THEREOF

TECHNICAL FIELD

The present disclosure relates to transistors and manufacturing methods thereof.

BACKGROUND

Generally, a transistor includes a gate that functions as a transistor electrode. The gate structure may be formed to include a gate insulating film and a poly-silicon film and may be provided on a semiconductor substrate corresponding to an active region, which is defined by device isolation regions.

As the requirement for more highly integrated semiconductor devices has increased, patterns of the devices, i.e., the widths and spaces between word and bit lines, have become smaller. In particular, the gate channel lengths are decreasing as the design rule of the gate becomes more highly integrated.

Such short channel construction typically improves transistor response speed. However, because the margins for the source/drain regions formed at both sides of the gate are reduced when the channel length is shortened, a significant leakage current is generated when the gate voltage is off. Moreover, the shortened channel characteristic and the increased leakage current contribute to a deterioration of a threshold voltage characteristic and a channel current characteristic of the device.

DETAILED DESCRIPTION

Figure 1:
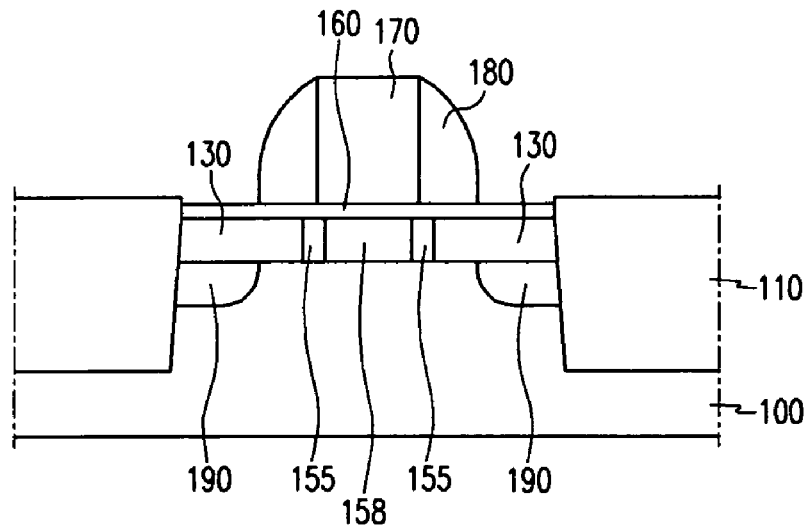
FIG. 1 is a cross-sectional view showing a transistor according to an example embodiment.

In general the example transistors and manufacturing methods described herein may be used to minimize the leakage current that occurs as a result of a short channel and, thus, improve the electric characteristics of a transistor.

One example transistor described herein includes a semiconductor substrate divided into device isolation regions and a device active region; a gate insulating film formed in the active region of the substrate; a gate formed on the gate insulating film; a channel region formed in the substrate and overlapping the gate; lightly doped drain (LDD) regions formed at both sides of the channel region to center the channel region; source and drain regions formed under the LDD regions; offset regions formed on the substrate and between the channel region and the LDD regions; and gate spacers formed at both sidewalls of the gate. In this example transistor structure, it is preferable that the offset regions comprise N-type impurity ions when the LDD regions comprise P-type impurity ions and the offset regions comprise P-type impurity ions when the LDD regions comprise N-type impurity ions.

A second example transistor includes a semiconductor substrate divided into device isolation regions and a device active region; a gate insulating film formed in the active region of the substrate; a gate formed on the gate insulating layer; LDD regions formed in the substrate and at both sides of the gate to center the gate; source and drain regions formed under the LDD regions; offset regions formed in the substrate and between the gate and LDD regions; and gate spacers formed at both sidewalls of the gate. In this example transistor structure, it is preferable that the offset regions comprise P-type impurity ions when the LDD regions comprise N-type impurity ions and the offset regions comprise N-type impurity ions when the LDD regions comprise P-type impurity ions. An example process for forming the offset region includes depositing a doped poly film on an ion-implanting buffer film and back-etching the deposited poly film. A preferable doped poly film has a thickness of 100 Å to 5000 Å.

A third example transistor includes a semiconductor substrate divided into device isolation regions and a device active region; a gate insulating film formed in the active region of the substrate; a gate formed on the gate insulating film; LDD regions formed on the substrate and at both sides of the gate to center the gate; offset regions formed on the substrate and between the gate and LDD regions; and gate spacers formed at both sidewalls of the gate, partially overlapping the offset regions.

An example transistor manufacturing process described herein forms an ion-implanting buffer film on an active region of a semiconductor substrate; forms LDD regions on the substrate by doping impurity ions thereon; forms a photoresist pattern wider than a gate formation region on the ion-implanting buffer film; partially removes the LDD regions using a mask of the photoresist film to expose the substrate; forms offset regions at opposite sides of the LDD regions; forms a gate insulating film on the substrate including the offset regions; forms a gate on the gate insulating film; forms gate spacers at both sidewalls of the gate; and forms source and drain regions by implanting conductive impurity ions with a mask of the gate spacers.

In the figures discussed in greater detail below, the thickness of layers, films, and regions are exaggerated for clarity. Also, like numerals refer to like elements throughout. It should be understood that when an element such as a layer, film, region, or substrate is referred to as being "on" another element, it can be directly on the other element or intervening elements may also be present.

FIG. 1 is a cross-sectional view showing an example transistor. Referring to FIG. 1, a gate insulating film 160 is formed on a semiconductor substrate 100 corresponding to a device active region defined by device isolation films 110. The gate insulating film 160 is made of an oxide film and has a thickness of 50 Å to 200 Å.

A gate 170 made of poly-silicon is formed on the gate insulating film 160, and gate spacers 180 are formed at both sidewalls of the gate 170. Lightly doped drain (LDD) regions 130 doped with a conductive impurity of a low concentration are formed in the substrate 100 underlying both end portions of the gate insulating film 160 to center the gate 170. Source and drain regions 190 doped with a conductive impurity of a high concentration are formed under the LDD regions 130.

A channel region 158 is formed under the surface of the substrate 100 overlapped with the gate 170. The channel region 158 consists of a silicon film resulting from a selective epitaxial growth process.

Offset regions 155 are formed between the channel region 158 and the LDD regions 130. The offset regions 155 are doped with conductive impurity ions opposite to that of the LDD regions 130, i.e., when the LDD regions 130 are doped with an N-type impurity, the offset regions 155 are doped with a P-type impurity, and vice versa.

Because the offset regions 155, which have ions opposite to those of the LDD regions 130, are positioned between the LDD regions 130 and the channel region 158, a leakage current generated when a gate voltage is off by the offset regions 155 is blocked and thus a stable electric characteristic of the device is obtained.

Figure 2A:
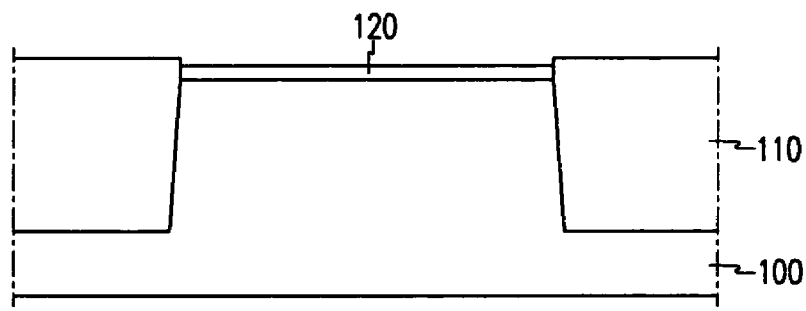
FIGS. 2a through 2i are cross-sectional views that depict manufacturing operations associated with the example embodiment of FIG. 1.
Figure 2B:
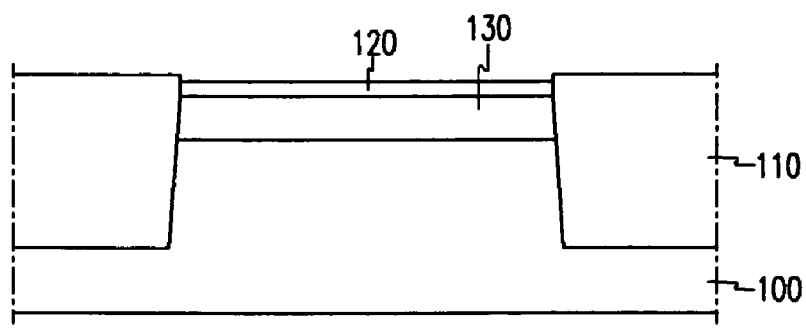

FIGS. 2a through 2i are cross-sectional views of manufacturing operations that may be used to manufacture the example transistor of FIG. 2. Beginning in FIG. 2a, an ion-implanting buffer film 120 is formed by an oxidation process of the substrate 100 where the device isolation films 110 are formed. Then, as shown in FIG. 2b, LDD regions are formed by doping N-or P-type conductive impurity ions of a low concentration on the substrate 100. At this time, the ion-implanting buffer film 120 prevents the substrate 100 from being damaged during the ion implantation process.

Figure 2C:
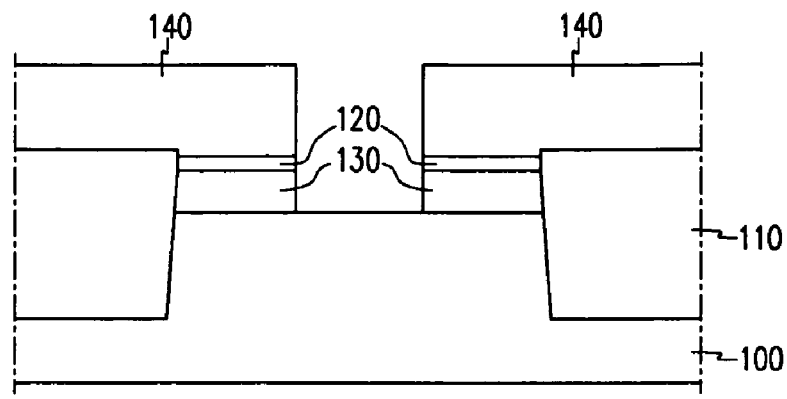

In the next operation, as shown in FIG. 2c, a photoresist pattern (not shown) that is wider than the gate active region is formed on the ion-implanting buffer film 120. Then, the ion-implanting buffer film 120 and the LDD regions 130 are etched using the photoresist pattern as a mask to partially expose the semiconductor substrate 100.

Figure 2D:
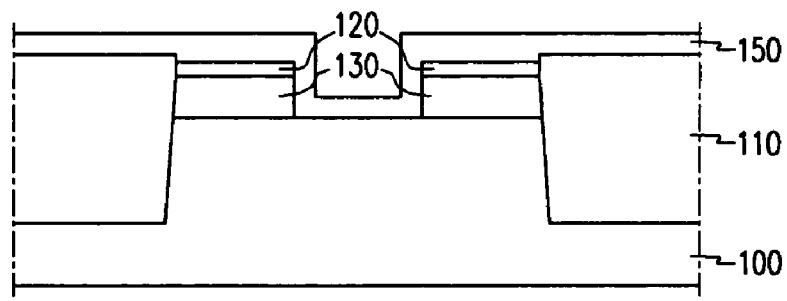

Next, as shown in FIG. 2d, an impurity ion doped silicon film 150 is formed over the semiconductor layer 100 including the ion-implanting film 120. Here, the impurity ions of the silicon film 150 are opposite to those of the LDD regions. That is, when the LDD regions are doped with N-type impurity ions, the silicon film 150 is doped with P-type, and viceoseus n lanting buffer film. A preferable final thickness of the doped silicon film 150 is 100 Å to 500 Å.

Figure 2E:
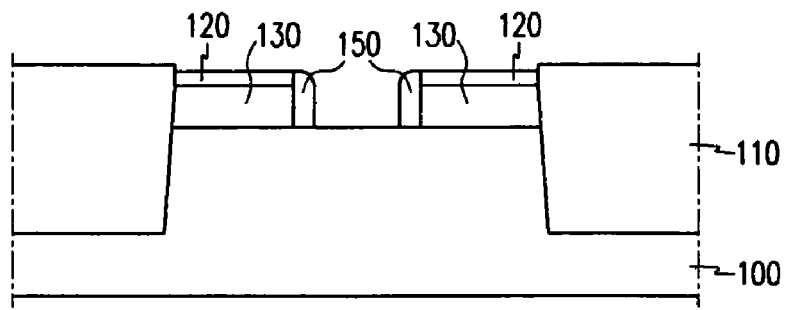

In the next operation as shown in FIG. 2e, the doped silicon film 150 is back-etched to form offset regions 155 at opposite sidewalls of the LDD regions 130. The resultant offset regions 155 consist of the doped silicon film and have a spacer-like shape. Further, in this etching operation, the buffer films 120 are etched and removed from the substrate 100 with the doped silicon film 150.

Figure 2F:
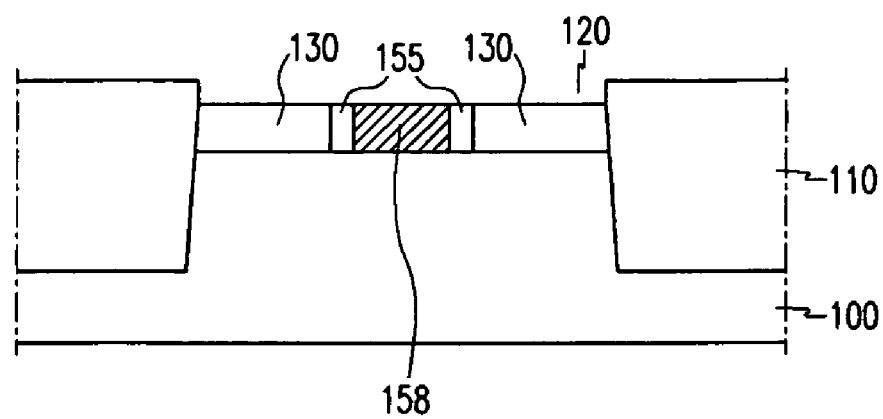

Then, as shown in FIG. 2f, the epitaxial growth process is carried out on the substrate 100 including the LDD regions 130 and the offset regions 155 up to the upper surfaces of the offset regions 155. A silicon grown film 158 is formed through this operation.

Figure 2G:
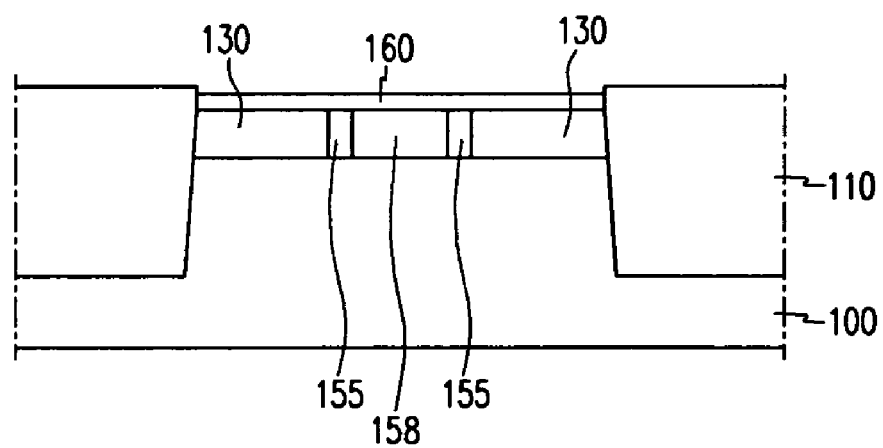

In the next operation as shown in FIG. 2g, an oxidation process is carried out on the active region of the semiconductor substrate 100 including the silicon grown film 158 to form a gate insulating film 160. The resultant gate insulating film 160 consists of an oxide film.

Figure 2H:
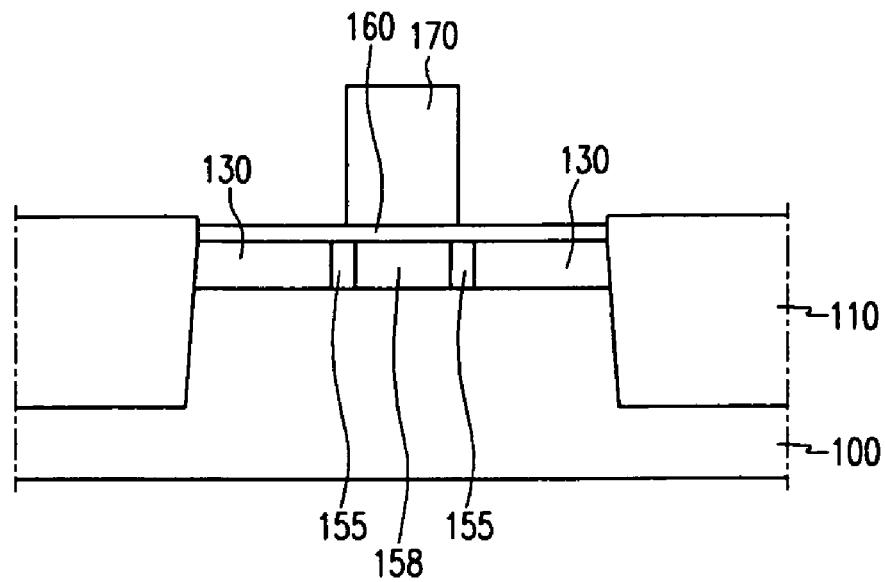

Subsequently, as shown in FIG. 2h, a poly-silicon film (not shown) is deposited on the gate insulating film 160, and a selective epitaxial process is carried out to form a gate 170 of poly-silicon. Here, a width (CD) of the resultant gate 170 can be controlled according to the characteristics of fabrication and the design rules.

Figure 2I:
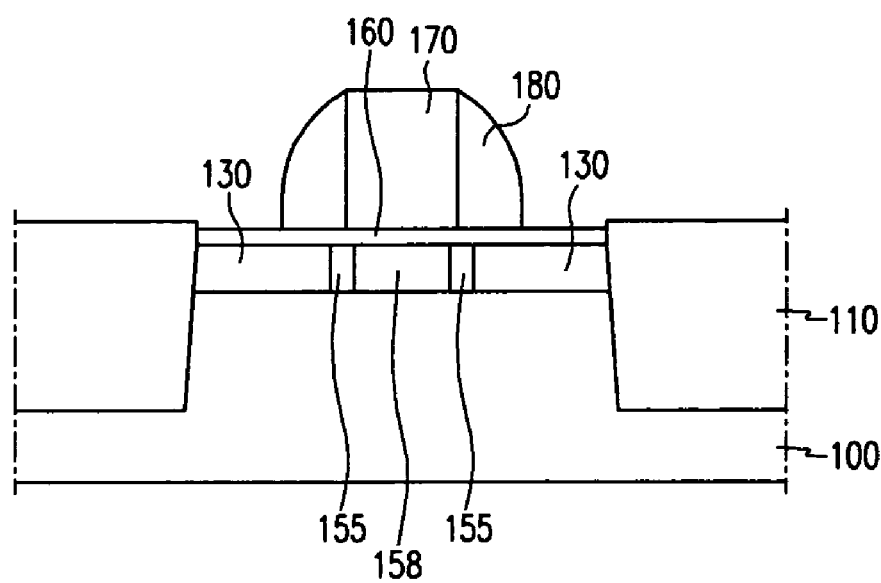

In the next operations as shown in FIG. 2i, an insulating material, i.e., oxide, nitride, etc. is deposited on the entire substrate 100 including the gate 170 and then back-etched to form gate spacers 180 at both sidewalls of the gate 170. Next, as shown in FIG. 1, conductive impurity ions of a high concentration are implanted into the substrate 100 using the gate 170 and the gate spacers 180 as a mask to form the source and drain regions 190.

Figure 3:
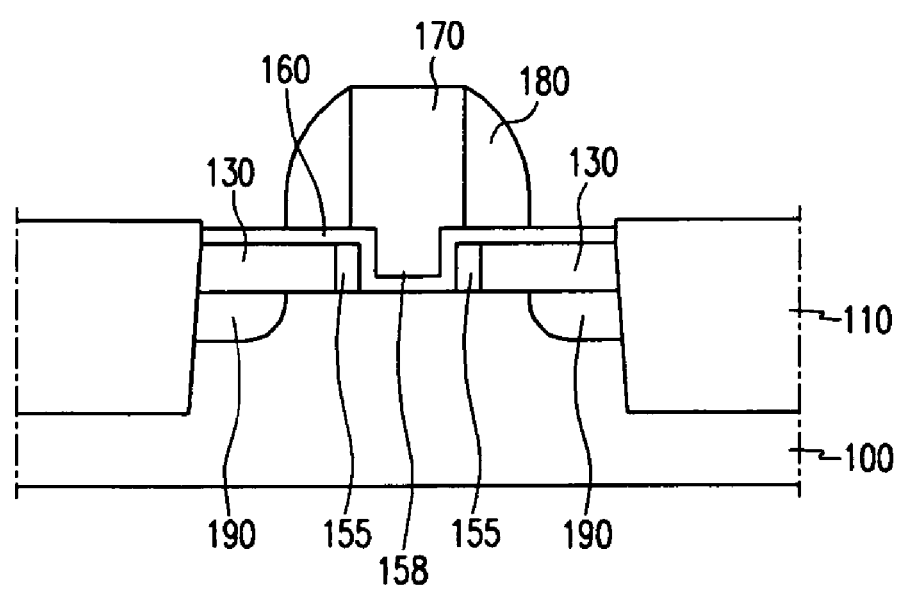
FIG. 3 is a cross-sectional view showing a transistor according to another example embodiment.

FIG. 3 is a cross-sectional view showing another example transistor having a structure similar to that of the example transistor of FIG. 1. Namely, a gate insulating film 160 is formed on a semiconductor substrate 100 corresponding to a device active region defined by device isolation films 110. A gate 170 is formed on the gate insulating film 160, and gate spacers 180 are formed at both sidewalls of the gate 170. LDD regions 130 are formed in the substrate 100 underlying both end portions of the gate insulating film 160 to center the gate 170. Source and drain regions 190 are formed under the LDD regions 130. Additionally, offset regions 155 are formed between the gate 170 and the LDD regions 130. A channel region (not shown) is formed under the surface of the semiconductor substrate 100 overlapped with the gate 170. Here, the bottom of the gate 170 is on the same layer as the bottom of the LDD region 130. As a result, the channel region of the gate 170 is positioned at a lower portion than the LDD regions 130. The example transistor of FIG. 3 not only provides the improved electrical characteristics of the example transistor of FIG. 1, but also provides an elevated source and drain effect.

Figure 4A:
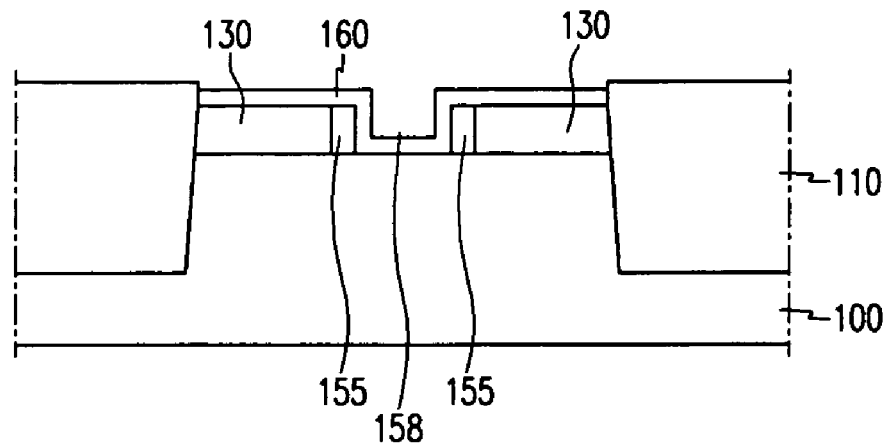
FIGS. 4a through 4c are cross-sectional views that depict manufacturing operations associated with the example embodiment of FIG. 3.
Figure 4B:
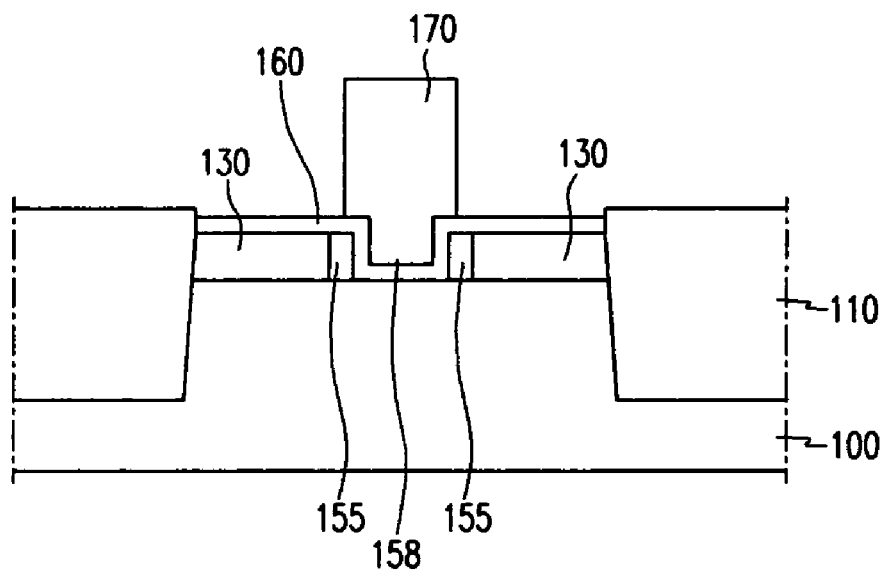
Figure 4C:
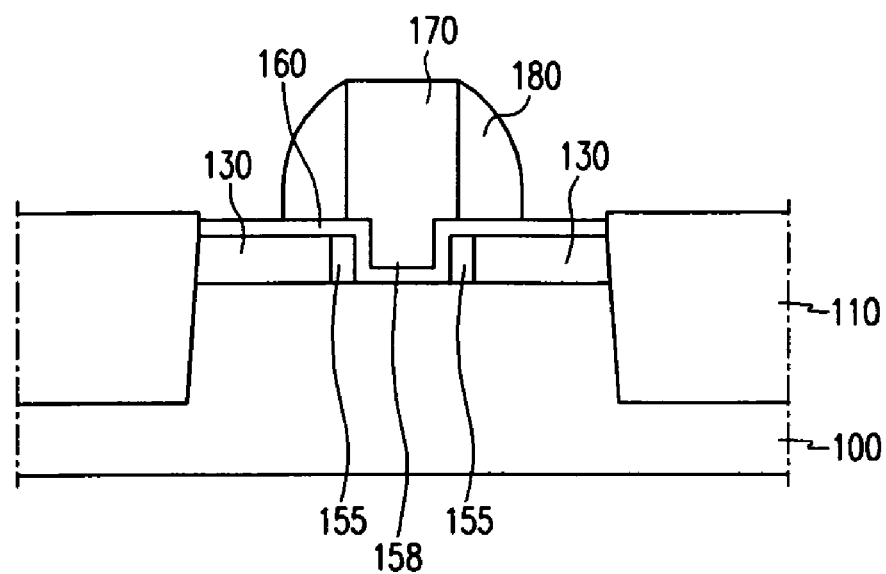

FIGS. 4a through 4c are cross-sectional views depicting example operations that may be used to manufacture the example transistor of FIG. 3. Initially, processes or operations similar to those shown in FIGS. 2a through 2e may be carried out. Then, as shown in FIG. 4a, an oxidation process is carried out on the active region of the substrate 100 having the LDD regions 130 and the offset regions 155 to form a gate insulating film 170. The resultant gate insulating film 170 consists of an oxide film.

Next, as shown in FIG. 4b, a poly-silicon film (not shown) is deposited on the gate insulating film 160, and selective etching is carried out to form a gate 170 of polysilicon. Here, a width of the gate 170 can be controlled according to the characteristics of the device and the design rules.

In the next operation as shown in FIG. 4c, an insulating material, i.e., oxide, nitride, etc. is deposited on the entire substrate 100 including the gate 170, and is then back-etched to form gate spacers 180 at both sidewalls of the gate 170.

In the next operation as shown in FIG. 3, to form source and drain regions 190, conductive impurity ions of a high concentration are implanted into the substrate 100 using a mask of the gate 170 and the gate spacers 180.

As mentioned above, the example transistors described herein can block a leakage current generated by a shortened gate length to meet the requirements of high-integrated devices by forming the offset regions between the LDD regions and the gate or the gate channel region. As a result, electrical stability of the device is obtained, and a short channel effect having a rapid response speed is also obtained.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A transistor manufacturing process comprising:
   (a) forming an ion-implanting buffer film on an active region of a semiconductor substrate;
   (b) forming LDD regions in the semiconductor substrate by doping the substrate with impurity ions;
   (c) forming a photoresist pattern wider than a gate formation region on the ion-implanting buffer film;

(d) removing the LDD regions partially using a mask of the photoresist film to expose the semiconductor substrate;

(e) forming offset regions at opposite sides of the LDD regions;

(f) forming a channel region on the exposed semiconductor substrate through a selective epitaxial growth process;

(g) forming a gate insulating film on the semiconductor substrate including the channel region;

(h) forming a gate on the gate insulating film, overlapping the channel region;

(i) forming gate spacers at both sidewalls of the gate; and (j) forming source and drain regions by implanting conductive impurity ions with a mask of the gate spacers.

2. The transistor manufacturing process of claim 1, wherein the offset regions are doped with P-type impurity ions when the LDD regions are doped with N-type impurity ions, and the offset regions are doped with N-type impurity ions when the LDD regions are doped with P-type impurity ions.

3. The transistor manufacturing process of claim 1, wherein the transistor-forming operation (e) comprises depositing a doped poly film on an ion-implanting buffer film and back-etching the doped poly film.

4. The transistor manufacturing process of claim 3, wherein the doped poly film has a thickness of 100 Å to 500 Å.

5. A transistor manufacturing process comprising:
(a) forming an ion-implanting buffer film on an active region of a semiconductor substrate;
(b) forming LDD regions in the semiconductor substrate by doping the substrate with impurity ions;
(c) forming a photoresist pattern wider than a gate formation region on the ion-implanting buffer film;
(d) partially removing the LDD regions using a mask of the photoresist film to expose the semiconductor substrate;
(e) forming offset regions at opposite sides of the LDD regions;
(f) forming a channel region on the exposed substrate through a selective epitaxial growth process;
(g) forming a gate insulating film on the semiconductor substrate including the offset regions;
(h) forming a gate on the gate insulating film;
(i) forming gate spacers at both sidewalls of the gate; and
(j) forming source and drain regions by implanting conductive impurity ions with a mask of the gate spacers.

6. The transistor manufacturing process of claim 5, wherein the offset regions are doped with P-type impurity ions when the LDD regions are doped with N-type impurity ions, and the offset regions are doped with N-type impurity ions when the LDD regions are doped with P-type impurity ions.

7. The transistor manufacturing process of claim 5, wherein the transistor forming operation (e) comprises depositing a doped poly film on an ion-implanting buffer film and back-etching the doped poly film.

8. The transistor manufacturing process of claim 6, wherein the doped poly film has a thickness of 100 Å to 500 Å.

* * * * *